United States Patent [19]
Kozlovsky et al.

[11] Patent Number: 5,283,798
[45] Date of Patent: Feb. 1, 1994

[54] LASER SCREEN FOR A CATHODE-RAY TUBE AND METHOD FOR MAKING SAME

[75] Inventors: Vladimir I. Kozlovsky; Andrey A. Kolchin, both of Moscow Oblast, U.S.S.R.

[73] Assignees: Principia Optics, Inc., Los Angeles, Calif.; P.N. Lebedev Institute of Physics, Moscow, U.S.S.R.

[21] Appl. No.: 875,822

[22] Filed: Apr. 30, 1992

[51] Int. Cl.$^5$ ............................................. H01S 3/19
[52] U.S. Cl. ...................................... 372/45; 372/43; 372/49; 372/99; 437/129
[58] Field of Search ...................... 372/45, 44, 43, 99, 372/107, 49; 437/129

[56] References Cited

U.S. PATENT DOCUMENTS

| | | | |
|---|---|---|---|
| 4,749,255 | 6/1988 | Chakraburti et al. | 372/45 |
| 4,955,031 | 9/1990 | Jain | 372/45 |
| 5,045,897 | 9/1991 | Ahlgren | 372/45 |
| 5,198,690 | 3/1993 | Kitagawa et al. | 372/44 |

Primary Examiner—Georgia Y. Epps
Attorney, Agent, or Firm—Marshall A. Lerner; John F. Sicotte

[57] ABSTRACT

A semiconductor member of a laser screen cathode-ray tube is made of a semiconductor compound selected from the group consisting of binary, three-component and four-component compounds of elements of the second and sixth Groups of the Periodic System and a support member is made of a semiconductor compound of the same type with a bandgap width such as to make it transparent for radiation generated by said screen. Maximum of 15% of atoms of the overgrown support member are substituted for isovalent atoms and the bandgap width of the support member is at least 0.1 eV greater than the bandgap width of the semiconductor member. The support member is overgrown from vapor phase on a partly transparent mirror deposited to one side of the semiconductor member forming an optical cavity with a reflecting mirror deposited to the opposite side of the semiconductor member.

8 Claims, 1 Drawing Sheet

LASER SCREEN FOR A CATHODE-RAY TUBE AND METHOD FOR MAKING SAME

FIELD OF THE INVENTION

The invention relates to electronic equipment and, in particular, to high-brightness kinescopes. More specifically, the invention deals with a laser screen for a cathode-ray tube which may be used in projection TV systems and with a method of making same. The invention may also be used for projection photolithography.

BACKGROUND OF THE INVENTION

Laser screens for cathode-ray tubes are known to have an optical cavity with a semiconductor member between the mirrors defining the resonator (V. I. Kozlovsly et al., Laser Screens of CdS, $CdS_xSe_{1-x}$ and ZnSe Monocrystalline Ingots (in Russian). J. Kvantovaya Elektronika. Moscow. 1977. Vol. 4. No. 2. pp. 351-354). The optical cavity is cemented to a transparent heat removing support member. Organic adhesive compositions are used to cement the optical cavity to the transparent support member. The laser screens of this type are deficient in the fact that they cannot withstand a thermal treatment in vacuum because of the use of an organic cementing layer between the optical cavity and the support member. In addition, the cementing layer degrades with time under the action of X-rays and partial penetration of the electron beam. Moreover, high thermoelastic stresses at the boundary between the semiconductor member and the cementing layer are caused by low heat conductance of the cementing layer. All these factors result in a short service life of such laser screens.

It is known to make a semiconductor laser with optical pumping, comprising a multiple-layer active structure which consists of an active layer, reflecting layers and a passive single-crystal epitaxial layer having different values of the bandgap width and different indices of refraction (Jewell, J. L. et al. Vertical Cavity Single Quantum Well Laser. Appl. Phys. Lett. 1989. Vol. 55. p. 424). This structure can be used as a laser screen for a cathode-ray tube. This device does not have a cementing layer because one layer of the structure is made thick enough to function as a heat removing support member. In addition all layers, including the reflecting layers defining an optical cavity, are single-crystal layers. A structure like this is prepared by a method comprising epitaxial overgrowth of layers of different compositions from organoelement compounds (Koyama F. et al. CaAlAs/GaAs MOCVD Growth for Surface Emitting Laser. Jap. J. of Appl. Phys. 1987. Vol. 26. No. 7. pp. 1077-1081). This method can only be carried out with a high perfection of structure of overgrown substrates and fair agreement between parameters of lattices of all overgrown single-crystal layers. This surface emitting laser structure is also deficient in the fact that it can be overgrown only by using a limited number of $A^{III}B^V$ semiconductor compounds emitting only in the near infrared spectral area. These compounds cannot be used for lasing in the visible spectral area.

SUMMARY OF THE INVENTION

It is an object of the invention to provide a laser screen for a cathode-ray tube which allows a laser screen to be produced with the use of a large range of semiconductor compounds for producing an image within the whole spectral range from infrared area to ultraviolet area.

Another object of the invention is to provide a method for making a cathode-ray tube involving a simple procedure yet ensuring high quality of image.

Still another object of the invention is to prolong service life of the laser screen.

With these and other objects in view, according to the invention, a semiconductor member of a laser screen cathode-ray tube of the type described above is made of a compound selected from the group consisting of binary, three-component and four-component compounds of elements of the second and sixth Groups of the Periodic System. A support member is made of the same semiconductor compound which has an energy bandgap width such as to make it transparent for radiation generated by the screen and in which maximum 15% of its atoms are substituted for isovalent atoms. The bandgap width of the compound of the support member is at least 0.1 eV greater than the bandgap width of the compound of the semiconductor member. The support member is overgrown on the partly transparent mirror.

The specific choice of compounds for making the semiconductor member and for making the overgrown support member is aimed at producing an image in the visible and ultraviolet spectral areas. Although the method according to the invention may be used for covering the entire spectral range, including the infrared area, it is well known to those skilled in the art that there are fairly acceptable options of materials (such as $A^{III}B^V$ semiconductors) for making infrared laser screens. For this reason, the specific choice of materials is claimed here to cover the visible and ultraviolet spectral area. Substituting a maximum of 15% of atoms of the compound overgrown on the partly transparent mirror for isovalent atoms in comparison with the compound used for making the semiconductor member allows reliability of the screen structure to be improved. This is because the support member is overgrown on the partly transparent mirror at a high temperature (900 to 1000 K.) and an operating temperature of the laser screen in a cathode-ray tube generally ranges from 80 to 300 K. With a strong disagreement between expansion coefficients of materials of the semiconductor member and support member this difference in temperature ranges can cause high thermoelastic stresses in the screen structure which may result in cracking or stratification of the screen structure or in a shorter service life in operation of the cathode-ray tube. The limitation that maximum 15% of atoms of the compound overgrown on the partly transparent mirror should be substituted for isovalent atoms imposes a limit which guarantees that expansion coefficients of the semiconductor member and overgrown support member remain close enough to each other so as to avoid such negative effect as described above and to prolong service life.

The support member which is overgrown on the partly transparent mirror, should be thick enough to ensure mechanical strength of the entire laser screen structure. On the other hand, the support member has to be transparent for laser radiation generated in the semiconductor member, i.e., it should offer minimum resistance to lasing. For this reason, the bandgap width of the compound of the support member should be at least 0.1 eV greater than the bandgap width of the compound of the semiconductor member. If the difference between the bandgap widths is smaller than 0.1 eV, losses of laser radiation in the support member overgrown on the partly transparent mirror become material so as to negatively affect performance of the cathode-ray tube. Brightness of the laser screen is substantially lowered in the first place, and energy transformation in the laser screen becomes ineffective.

This laser screen allows a larger range of materials to be used for making laser screens to cover the entire spectral area from infrared to ultraviolet areas.

The support member may be overgrown of a graded-bandgap semiconductor compound having at least a part of its thickness which has a bandgap width at least 0.1 eV greater than the bandgap width of the semiconductor member. In another embodiment a layer of a graded-bandgap semiconductor compound is overgrown on the side of the partly transparent mirror to have a bandgap width varying from the bandgap width of the semiconductor member to the bandgap width of the support member.

The support member is overgrown on the partly transparent mirror in a flow-through quartz reactor with a neutral transport gas. Overgrowing the support member on the partly transparent mirror ensures a bond to be formed between the support member and the optical cavity at the molecular level which allows a fair thermal and electric contact between the support member and the optical cavity to be provided. This enhances lasing performance of the screen and prolongs its service life. At the same time, the presence of the partly transparent mirror between the active single-crystal semiconductor member and the support member constitutes a barrier against diffusion of atoms between these components of the laser screen under the action of temperature and other factors during manufacture. By the same token, such diffusion, which can also occur in operation of a cathode-ray tube with the laser screen under the effect of an electron beam and intensive recombination of non-equilibrium charge carriers, is also prevented.

DESCRIPTION OF THE DRAWINGS

The invention will now be described in detail with reference to the accompanying drawings illustrating practical implementation of the invention, in which identical details are shown at identical reference numerals and which.

DESCRIPTION OF PREFERRED EMBODIMENTS

Figure 1:
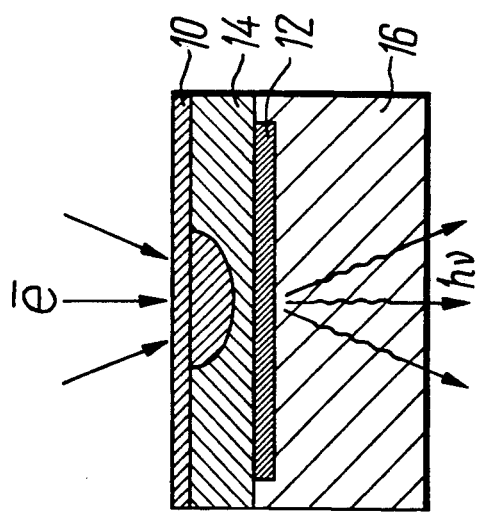
FIG. 1 diagrammatically shows a sectional view of a laser screen for a cathode ray tube according to the invention.

As shown in FIG. 1, a laser screen has an electrically conducting reflecting mirror 10 and a partly transparent mirror 12 which form an optical cavity. A semiconductor member 14 generally in the form of a single-crystal wafer is provided between mirrors 10 and 12 and constitutes the active component of the laser screen which can be excited by means of an electron beam for lasing. For normal operation of a laser screen, it should have a transparent heat removing support member. This support member, which is shown at 16, is overgrown on partly transparent mirror 12. According to the invention, semiconductor member 14 is made of a compound selected from the group consisting of binary, three-component and four-component compounds of elements of the second and sixth Groups of the Periodic System. Support member 16 is overgrown on partly transparent mirror 12 of a semiconductor compound. A bandgap width of the overgrown semiconductor compound is such as to make it transparent for radiation generated by the screen. This is the same semiconductor compound as that used for making semiconductor member 14, but a maximum of 15% of its atoms are substituted for isovalent atoms.

Figure 2:
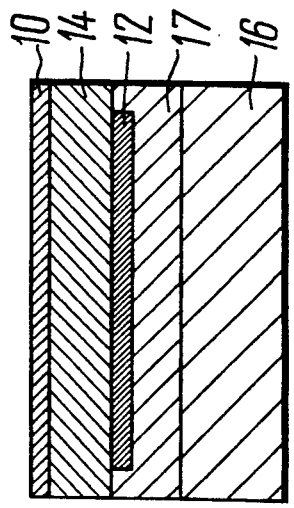
FIG. 2 diagrammatically shows another embodiment of a laser screen for a cathode ray tube according to the invention in which a support member has a layer of a graded-bandgap semiconductor compound overgrown on a partly transparent mirror.

The embodiment shown in FIG. 2 differs from that shown in FIG. 1 only by the fact that support member 16 has a layer 17 overgrown on partly transparent mirror 12 of a graded-bandgap semiconductor compound in which a bandgap width varies from the bandgap width of semiconductor member 14 to the bandgap width of the rest of support member 16 which is at least 0.1 eV greater than the bandgap width of semiconductor member 14. In the embodiment shown in FIG. 2 support member 16 can be overgrown of a graded-bandgap semiconductor compound in which at least a part of its thickness has a bandgap width at least 0.1 eV greater than the bandgap width of semiconductor member 14. It will be apparent to those skilled in the art that the bandgap width preferably gradually increases in a direction away from partly transparent mirror 12.

In operation of all the embodiments of the laser screen according to the invention described above an electron beam penetrates reflecting mirror 10 to excite semiconductor member 14. Electromagnetic radiation is thus generated in the optical cavity formed by mirrors 10 and 12.

This radiation emerges through overgrown support member 16. Since semiconductor member 14 and support member 16 are made of compounds selected from the group consisting of binary, three-component and four-component compounds of elements of the second and sixth Groups of the Periodic System, the emitted radiation is visible in the whole spectral range from ultraviolet spectral area to infrared spectral area. The limitations concerning the ratio of the bandgap widths of semiconductor member 14 and support member 16 ensure the unhampered passage of radiation through support member 16 without any appreciable absorption losses. There is no substantial difference in operation of the three above-described embodiments of the laser screen according to the invention. The difference between them may be of a purely manufacturing nature. It is well known to those skilled in the art that the bandgap width of a three-component or four-component semiconductor compound which is overgrown from a vapor phase depends on process parameters, and in particular, on concentration or on a rate of supply of one of components of a semiconductor compound to a reactor in which the process is conducted. A graded-bandgap structure is made for reducing a mismatch of lattices between semiconductor member 14 and support member 16. This mismatch causes appearance of strains between the two members of the laser screen which are conducive to its degradation. In order to relieve the strain, transition layer 17 is made between partly transparent mirror 14 and the rest of support member 16 as shown in FIG. 2. The same mismatch also applies to the embodiment in which support member 16 of a three-component or four-component semiconductor compound has a graded-bandgap structure, with a bandgap width preferably increasing in a direction away from partly transparent mirror 12. It is understood that the bandgap width of at least a part of the thickness of support member 16 in this case is at least 0.1 eV greater than the bandgap width of semiconductor member 14 so as to make support member 16 transparent for lasing.

The above-described laser screen for a cathode-ray tube is made as described below with reference to FIG. 3 which illustrates steps of a method for making a laser screen according to the invention.

Figure 3A:
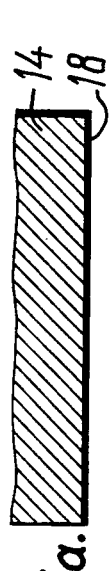
FIGS. 3 (a–e) illustrates steps of a method for making a laser screen according to the invention.
Figure 3B:
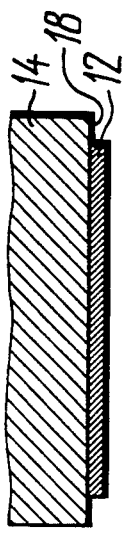

Semiconductor member 14 shown in FIG. 3(a) is made by appropriately cutting a single-crystal wafer off an ingot of a semiconductor compound such as CdS, ZnS, ZnSe, or $CdS_xSe_{1-x}$, $ZnS_xSe_{1-x}$, $Zn_xCd_{1-x}S$, $Zn_{1-x}Cd_xSe$, or $Zn_xCd_{1-x}S_ySe_{1-y}$ which are most widely used for making laser screens for cathode-ray tubes. The wafer is cut off to have a predetermined orientation. One side of the wafer is polished as shown at 18 to obtain a component shown in FIG. 3(a). Partly transparent mirror 12 is formed on polished side 18 of semiconductor wafer 14 as shown in FIG. 3(b). It is preferred that partly transparent mirror 12 be made of a chemically and heat resistant material. Such mirrors are generally made in the form of multiple-layer mirrors consisting of alternating layers of $ZrO_2$ and $Al_2O_3$ formed by vacuum sputtering. Other pairs of components with lower or greater indices of refraction such as $SiO_2$-$TiO_2$, $SiO_2$-$HfO_2$ may also be used. It is, however, noted that expansion coefficients of $ZrO_2$ and $Al_2O_3$ are most similar to $A^{II}B^{VI}$ semiconductor compounds which are used for the purposes of this invention. It is, therefore, preferred that these compounds be used for forming partly transparent mirror 12 so as to prolong service life of the laser screen according to the invention and to ensure a better uniformity of lasing. It should be noted that the requirements are imposed upon heat and chemical resistance of partly transparent mirror 12 because this component of the laser screen is then coated with overgrown support member 16 in a chemical process conducted at high temperatures. To ensure a strong bond between multiple-layer partly transparent mirror 12 and semiconductor member 14, the sputtering is preferably carried out at a temperature of the wafer ranging from 450 to 600K. If the sputtering is carried out at a temperature below 450K, the mirror can be damaged when support member 16 is overgrown. If the sputtering is carried out at a temperature above 600K, the surface of semiconductor member 14 is oxidized during the sputtering which can result in a change in the lasing properties of the semiconductor member and of the mirror proper.

Figure 3C:
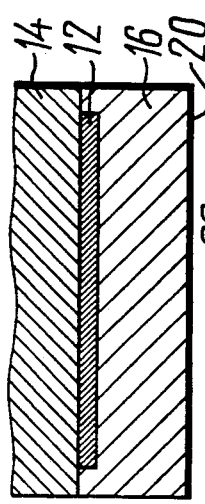

During the next step support member 16 is overgrown on partly transparent mirror 12 as shown in FIG. 3(c). This support member is overgrown of a semiconductor compound with a bandgap width such as to make it transparent for radiation generated by the screen. This compound is overgrown of the same semiconductor compound that was used for making semiconductor member 14, but maximum 15% of its atoms are substituted for isovalent atoms. A change in composition of the semiconductor compound such as $A_xB_{1-x}C$ may be either with an increase or a decrease in x which is the parameter of composition. This limitation is combined with the limitation of a difference in the bandgap width such as to ensure unhampered passage of radiation through support member 16. The latter limitation makes the limitation of composition of the compound used for making support member 16 quite definite. The difference between the bandgap widths of semiconductor member 14 and support member 16 should be at least 0.1 eV. If the difference between the bandgap widths is smaller than 0.1 eV, losses of laser radiation in the support member overgrown on the partly transparent mirror become material so as to negatively affect performance of the cathode-ray tube.

Since requirements imposed upon structural properties of the overgrown support member are not very stringent (because this is a passive layer), this support member may be polycrystalline and can be overgrown at comparatively low temperatures. One of the most efficient methods for overgrowing semiconductor compounds at low temperatures is a method of chemical deposition from vapor phase or a so called CVD growth technique. The temperature range for overgrowing support member 16 and the proportioning of gas flows depend on the support member material and acceptable growth rate. It is preferred that support member 16 be overgrown at a temperature ranging from 900 to 1100K. This temperature range was found to be an optimum one for uniform lasing and prolonged service life of the laser screen. If a temperature is below 900K, the bond between support member 16 and partly transparent mirror 12 is inadequate (because it is more difficult to obtain a strong bond when a semiconductor is overgrown on oxides and not vice versa). With a temperature above 1100K, there is a danger of cracking of partly transparent mirror 12 even if the most ideal combination of $ZrO_2$ and $Al_2O_3$ is used.

It should be noted that other known methods may be used for overgrowing of a support member. For example it may be made by static resublimination in quartz ampula which is usually used for manufacturing single crystal ingots. But in this case it is necessary to use higher growing temperatures. A hydrothermal method of growing crystal ingots and many epitaxial technologies such as MBE or MOCVD may also be used, however these methods are not effective for growing layers with large thickness or support member.

It is preferred that support member 16 be overgrown in a flow-through quartz reactor with an inert transport gas such as argon. In a specific preferred embodiment, semiconductor member 14 is made of $CdS_{0.9}Se_{0.1}$ and partly transparent mirror 14 is formed by vacuum sputtering of $ZrO_2$ and $Al_2O_3$ at 450 to 600K. Support member 16 is overgrown with CdS to a thickness of 3 to 10 mm by chemical deposition from vapor phase in a quartz reactor at 900 to 1100K with a molar ratio of cadmium vapor to hydrogen sulfide vapor and to inert argon gas of about (1 to 1.5) to 1 to about (200 to 400). The above-mentioned temperature range and the ratios of gas flows for overgrowing a CdS support member give a growth rate of 0.01 to 0.025 μm/s so that support member 16 about 1 cm thick can be overgrown in about 100 hours which is comparable with the growth rate of a single-crystal semiconductor member. It is understood that these temperatures and proportioning of the components may vary for different semiconductor compounds.

Figure 3D:
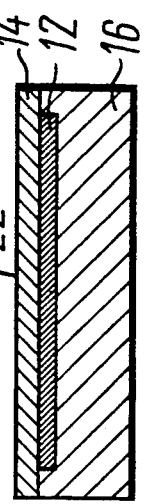
Figure 3E:
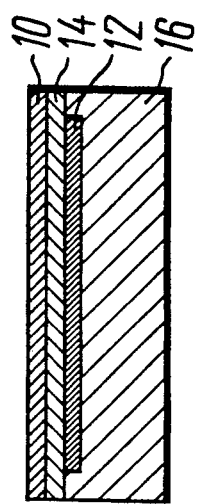

At the next step, the lower side of semiconductor support member 16 is polished to a desired thickness to obtain a polished side 20 as shown in FIG. 3(c), and the opposite side of semiconductor member 14 is also polished as shown at 22 to obtain the desired thickness of semiconductor member 14 as shown in FIG. 3(d). Reflecting electrically conducting mirror 10, e.g., in the form of a silver layer is then deposited on side 22 of semiconductor member 14 to form an optical cavity with mirror 12. At this stage the laser screen manufacture is completed as shown in FIG. 3(e).

The invention will be illustrated with reference to the following examples of its practical implementation.

EXAMPLE 1

A wafer 50 mm in diameter and 1.5 mm thick was cut out of a single-crystal ingot of $Cd_{0.9}Se_{0.1}$ (cadmium selenide) with an orientation of 0001. One side of the wafer was ground and chemically and mechanically polished. A mirror coating consisting of eleven quarter-wave layers of $Al_2O_3$ and $ZrO_2$ was sputtered to this side of the wafer at 550K. A support member 10 mm thick was overgrown of CdS on this coating by a known CVD growth technique in a flow-through quartz reactor at 1100K with the molar ratio of cadmium to hydrogen sulfide vapors and to argon of 1.2:1:300. The quartz reactor was a part of quartz tube having an inner diameter about 55 mm. It was placed into a resistive furnace having five temperature zones. Gas flow was introduced into one end of the tube was purified $H_2S$ and Argon. Mass flow controllers maintained the flow rates to within 1%. Purified Cd granules were placed upstream in a crucible inside the tube. The crucible with the metallic component was heated to 540° C. The semiconductor wafer with the coated mirror facing upstream towards the gas flow was placed into a reactor vertically at an angle with respect to the gas flow. Heating to growing temperature was carried in an argon(inert gas) atmosphere.

It is noted that only 5% of atoms of $CdS_{0.9}Se_{0.1}$ were substituted (10% Se for S). The bandgap width of the support member was 0.1 eV greater than the bandgap width of the wafer compound. The other side of the semiconductor wafer was ground and polished to a thickness of 10 μm, and silver coating 0.08 μm thick was sputtered to this polished surface.

The resulting laser screen was used in a cathode-ray tube at room temperature for lasing at 540 nm. When excited with a scanning electron beam in the television scanning mode with an energy of electrons of 60 to 75 keV, current density of 200 A/sq. cm, and electron spot diameter of about 15 μm, this laser screen had an efficiency of transformation of electron beam energy to light (lasing efficiency) of at least 0.07. An estimated service life was about 1000 hours in the TV scanning mode. An evaluation of service life was made from an experiment in which a television picture was compressed 20 times along a direction of vertical sweeping and a time of falling of output light power up to 80% of former value was measured under controlling an average temperature of the laser screen at nearly room temperature. This time was multiplied by a factor of 20 for evaluation of service life.

For the sake of comparison, a prior art laser screen having a semiconductor layer of $CdS_{0.9}Se_{0.1}$ having a thickness of 10 μm, with a cementing layer 10 μm thick, a sapphire support member and the same mirror layers as described in Example 1 had a lasing efficiency of 0.05 with an estimated service life of one hour. This laser screen could not be used in sealed-off tubes.

EXAMPLE 2

A laser screen was made as described in Example 1, with the following differences: a mirror coating was sputtered at 450K, a support member of CdS was overgrown to a thickness of 3 mm at 900K with the ratio of cadmium to hydrogen sulfide vapors and to argon of 1:1:200. The resulting laser screen was used at room temperature for lasing at 540 nm with a lasing efficiency of at least 0.1. An estimated service life was at least 800 hours in the TV scanning mode. The advantage over the prior art is a prolonged service life and a two-fold increase in lasing efficiency. The laser screen was suitable for sealed-off tubes.

EXAMPLE 3

A laser screen was made as described in Example 1, with the following differences: an interference mirror coating was sputtered at 600K, a support member of CdS was overgrown to a thickness of 5 mm at 1000K and with the ratio of cadmium to hydrogen sulfide vapors and to argon of 1.5:1:400.

The resulting laser screen was used at room temperature for lasing at 540 nm with a lasing efficiency of at least 0.06. An estimated service life was at least 1000 hours in the TV scanning mode. The advantage over the prior art is a prolonged service life and an increase in lasing efficiency. The laser screen was suitable for sealed-off tubes.

EXAMPLE 4

A laser screen for a cathode-ray tube had a semiconductor member of a three-component compound $CdS_{0.7}Se_{0.3}$ of a thickness of 20 μm and 50 mm in diameter, having a silver layer 0.08 μm thick deposited on one side and a nine-layer partly transparent mirror of quarter-wave layers of $SiO_2$ and $TiO_2$ on the other side, and a support member of binary compound CdS 5 mm thick overgrown on the partly transparent mirror. The bandgap width of the support member was 0.25 eV greater than the bandgap width of the compound $CdS_{0.7}Se_{0.3}$, and 15% of isovalent atoms were substituted in the support member compound in comparison with this compound.

The resulting laser screen was used at room temperature for lasing at 590 nm with a lasing efficiency of at least 0.05. An estimated service life was at least 1000 hours in the TV scanning mode. The laser screen was suitable for sealed-off tubes.

EXAMPLE 5

A laser screen was made as in Example 4, but it had a semiconductor member of a binary CdS compound. A support member was 5 mm thick and was overgrown of a three-component semiconductor compound $Zn_xCd_{1-x}S$ to have a graded-bandgap structure with a gradual increase in the bandgap width in a direction away from semiconductor member. The parameter "x" of composition of the semiconductor compound was 0.1 in the vicinity of the semiconductor member. This corresponded to an increment of the bandgap width at 0.13 eV. The parameter "x" was 0.2 on the exposed surface of the support plate which corresponded to an increment of the bandgap width at 0.26 eV. Changes in composition of the compound corresponded to substitution of 5 and 10% of atoms for isovalent atoms, respectively.

This laser screen was suitable for a sealed of cathode-ray tube. The laser screen was used for lasing at 520 nm and had a lasing efficiency of up to 0.1.

EXAMPLE 6

A laser screen was made as described in Example 5, but the semiconductor member was made of a four-component semiconductor compound $Zn_{0.2}Cd_{0.8}S_{0.9}Se_{0.1}$ and the support member was overgrown of a four-component semiconductor compound $Zn_xCd_{1-x}S_{1-y}Se_y$ in which parameters of the composition varied in the direction of its thickness within the range of 20% with respect to average values of $x=0.3$ and $y=0.05$. The composition of the support member differed from the composition of the semiconductor member by substitution of 7.5% of atoms for isovalent atoms. The bandgap width was 0.18 eV wider. This laser screen was suitable for a sealed-off cathode-ray tube. It was used for lasing at 485 nm and had a lasing efficiency of about 0.05 at room temperature.

EXAMPLE 7

A laser screen was made as described in Example 5, but the semiconductor member was made of a three-component semiconductor compound $CdS_{0.9}Se_{0.1}$ and the support member was overgrown of a three-component compound $Zn_{0.1}Cd_{0.9}S$ with a bandgap width which was 0.2 eV wider than the bandgap width of the semiconductor member, with a composition having 10% of substituted isovalent atoms.

The laser screen was used for lasing at 540 nm at room temperature with a lasing efficiency of about 0.07. It could be used in sealed-off tubes.

EXAMPLE 8

A laser screen was made as described in Example 5, but the semiconductor member was made of $ZnS_{0.9}Se_{0.1}$, the support member was overgrown with ZnS, and the partly transparent mirror was formed of eleven layers of $HfO_2$ and $Al_2O_3$. The bandgap width of the support member was 0.1 eV greater in comparison with that of the semiconductor member and 5% of atoms were substituted for isovalent atoms. This laser screen was suitable for sealed-off tubes for lasing at 340 nm at 80K with a lasing efficiency of 0.06 and for lasing at 357 nm at 300K with a lasing efficiency of 0.02.

EXAMPLE 9

A laser screen was made as described in Example 8, but the support member had a graded-bandgap layer 50 $\mu$m thick on the side of the partly transparent mirror in which a bandgap width varied from the bandgap width of the semiconductor compound $ZnS_{0.9}Se_{0.1}$ of the semiconductor member to the bandgap width of the rest of the support member made of ZnS. The resulting laser screen had a service life which was at least 1.5 times as long as the laser screen of Example 8.

Preferred non-limiting and explanatory embodiments of the invention have been described above. It is understood that various modifications and supplements may be made by those skilled in the art which do not go beyond the spirit and scope of the invention as defined in the attached claims.

We claim:

1. A semiconductor for a laser screen, comprising:
an optical cavity comprising a partly transparent mirror and a reflecting mirror;
a semiconductor member made of a compound selected from the group consisting of binary, three-component and four-component compounds of elements of the second and sixth Groups of the Periodic System positioned between said partly transparent mirror and said reflecting mirror; and
a support member overgrown on said partly transparent mirror of said semiconductor compound of which said semiconductor member is made, maximum 15% of atoms of said overgrown semiconductor compound being substituted for isovalent atoms, the bandgap width of the semiconductor compound of said support member being such as to make it transparent for radiation generated by said screen.

2. The invention as described in claim 1, wherein a bandgap width of said compound of said support member overgrown on said partly transparent mirror is at least 0.1 eV greater than the bandgap width of said compound of said semiconductor member.

3. The invention as described in claim 1, wherein a bandgap width of said compound of said support member overgrown on said partly transparent mirror is at least 0.1 eV greater than the bandgap width of said compound of said semiconductor member and wherein said support member has a graded-bandgap layer on the side of said partly transparent mirror, the bandgap width within said graded-bandgap layer varying from the bandgap width of said semiconductor member to said bandgap width of said support member.

4. The invention as described in claim 1, wherein said support member is overgrown of a graded-bandgap semiconductor compound having at least a part of its thickness which has a bandgap width at least 0.1 eV greater than the bandgap width of said compound of said semiconductor member.

5. A method of making a laser screen having an optical cavity comprising a partly transparent mirror and a reflecting mirror, a semiconductor member which has a first side and a second side opposite to said first side and which is made of a compound selected from the group consisting of binary, three-component and four-component compounds of elements of the second and sixth Groups of the Periodic System, and a support member, said method, comprising:
polishing said first side of said semiconductor member;
forming a partly transparent mirror on said first polished side of said semiconductor member;
overgrowing on said partly transparent mirror a support member of said semiconductor compound of which said semiconductor member is made with a maximum of 15% of atoms of said overgrown semiconductor compound being substituted for isovalent atoms, the bandgap width of said compound of said support member being at least 0.1 eV greater than the bandgap width of said compound of said semiconductor member, in a flow-through quartz reactor containing an inert gas;
polishing said second side of said semiconductor member; and
forming a reflecting mirror on said second polished side of said semiconductor member.

6. The method of claim 5, wherein said semiconductor member is made of $CdS_{0.9}Se_{0.1}$ and wherein said partly transparent mirror is formed by vacuum sputtering of $ZrO_2$ and $Al_2O_3$ at 450 to 600K, said support member being overgrown of CdS to a thickness of 3 to 10 mm by chemical deposition from vapor phase in a quartz reactor at 900 to 1100K with a molar ratio of cadmium vapor to hydrogen sulfide vapor and to argon gas of about (1 to 1.5) to 1 to about (200 to 400).

7. The method of claim 5, wherein a graded-bandgap layer is first overgrown on said partly transparent mirror with a bandgap width within said graded-bandgap layer varying from the bandgap width of said semiconductor member to said bandgap width of said support member and wherein the rest of said support member is overgrown to have a bandgap width at least 0.1 eV greater than the bandgap width of said compound of said semiconductor member.

8. A method of claim 5, wherein said support member is overgrown in the form of a graded-bandgap semiconductor compound having at least a part of its thickness which has a bandgap width at least 0.1 eV greater than the bandgap width of said compound of said semiconductor member.

* * * * *

UNITED STATES PATENT AND TRADEMARK OFFICE
CERTIFICATE OF CORRECTION

PATENT NO. : 5,283,798
DATED : Feb. 1, 1994
INVENTOR(S) : Kozlovsky, et al.

It is certified that error appears in the above-indentified patent and that said Letters Patent is hereby corrected as shown below:

On the title page, items [75] and [73] should read as follows:
[75]  Inventors:   Vladimir I. Kozlovsky; Andrey A. Kolchin, both of Moscow Oblast, RUSSIA

[73]  Assignee:    Principia Optics, Inc., Los Angeles, CA; P.N. Lebedev Institute of Physics, Moscow, RUSSIA On the title page, after item [22] Filed: insert the following:
[30]  Foreign Appl. Priority Data:
                Dec. 26, 1991 [RUS] Russia.......N5016149/21

Signed and Sealed this

First Day of November, 1994

Attest:

BRUCE LEHMAN

*Attesting Officer*   *Commissioner of Patents and Trademarks*